(12) United States Patent
Bohr (10) Patent No.: US 6,566,737 B2
(45) Date of Patent: *May 20, 2003

(54) PASSIVATION STRUCTURE FOR AN INTEGRATED CIRCUIT

(75) Inventor: Mark T. Bohr, Aloha, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/115,418

(22) Filed: Jul. 14, 1998

(65) Prior Publication Data

US 2002/0064929 A1 May 30, 2002

Related U.S. Application Data

(62) Division of application No. 09/001,551, filed on Dec. 31, 1997, now Pat. No. 6,143,638.

(51) Int. Cl.[7] .............................................. H01L 23/58
(52) U.S. Cl. ....................................... 257/635; 257/784
(58) Field of Search .............................. 257/635–645, 257/382–385, 734–786; 438/612, 633

(56) References Cited

U.S. PATENT DOCUMENTS

| | | | |
|---|---|---|---|
| 5,565,378 A | 10/1996 | Harada et al. | |
| 5,578,523 A | * 11/1996 | Fiordalice | 438/633 |
| 5,585,280 A | * 12/1996 | Kwasnick et al. | 438/69 |
| 5,661,082 A | 8/1997 | Hsu et al. | |
| 5,677,239 A | 10/1997 | Isobe | |
| 5,728,631 A | * 3/1998 | Wang | 438/787 |
| 5,923,179 A | * 7/1999 | Taylor | 324/755 |
| 5,985,765 A | * 11/1999 | Hsiao et al. | 438/694 |
| 5,989,992 A | * 11/1999 | Yabu | 438/162 |

FOREIGN PATENT DOCUMENTS

JP          63308924         12/1988

* cited by examiner

*Primary Examiner*—Wael Fahmy, Jr.
*Assistant Examiner*—Marcos D. Pizarro-Crespo
(74) *Attorney, Agent, or Firm*—Blakely, Sokoloff, Taylor & Zafman LLP (57) ABSTRACT

A novel passivation structure and its method of fabrication. According to the present invention a first dielectric layer is formed upon a conductive layer formed over a substrate. The first dielectric layer and the conductive layer are then patterned into a first dielectric capped interconnect and a dielectric capped bond pad. Next, a second dielectric layer is formed over and between the dielectric capped interconnect and the dielectric capped bond pad. The top portion of the second dielectric layer is removed so as to expose the dielectric capped bond pad and the dielectric capped interconnect. A third dielectric layer is then formed over the exposed dielectric capped bond pad and the exposed dielectric capped interconnect and over the second dielectric.

17 Claims, 10 Drawing Sheets

PASSIVATION STRUCTURE FOR AN INTEGRATED CIRCUIT

This is a divisional application of Ser. No. 09/001,551 filed on Dec. 31, 1997, now U.S. Pat. No. 6,143,638.

BACKGROUND OF THE INVENTION

1. Field of the Invention

The present invention relates to the field of semiconductor integrated circuit manufacturing, and more specifically to a passivation structure and its method of fabrication.

2. Discussion of Related Art

Integrated circuits are made up of literally millions of individual devices such as transistors and capacitors formed on a semiconductor substrate. The devices are integrated together by alternating conductive and insulating layers to form functional circuits such as microprocessors. The final layer deposited is typically a passivation layer which is an insulating layer which provides protection against mechanical and chemical damage during assembly and packaging.

Figure 1:
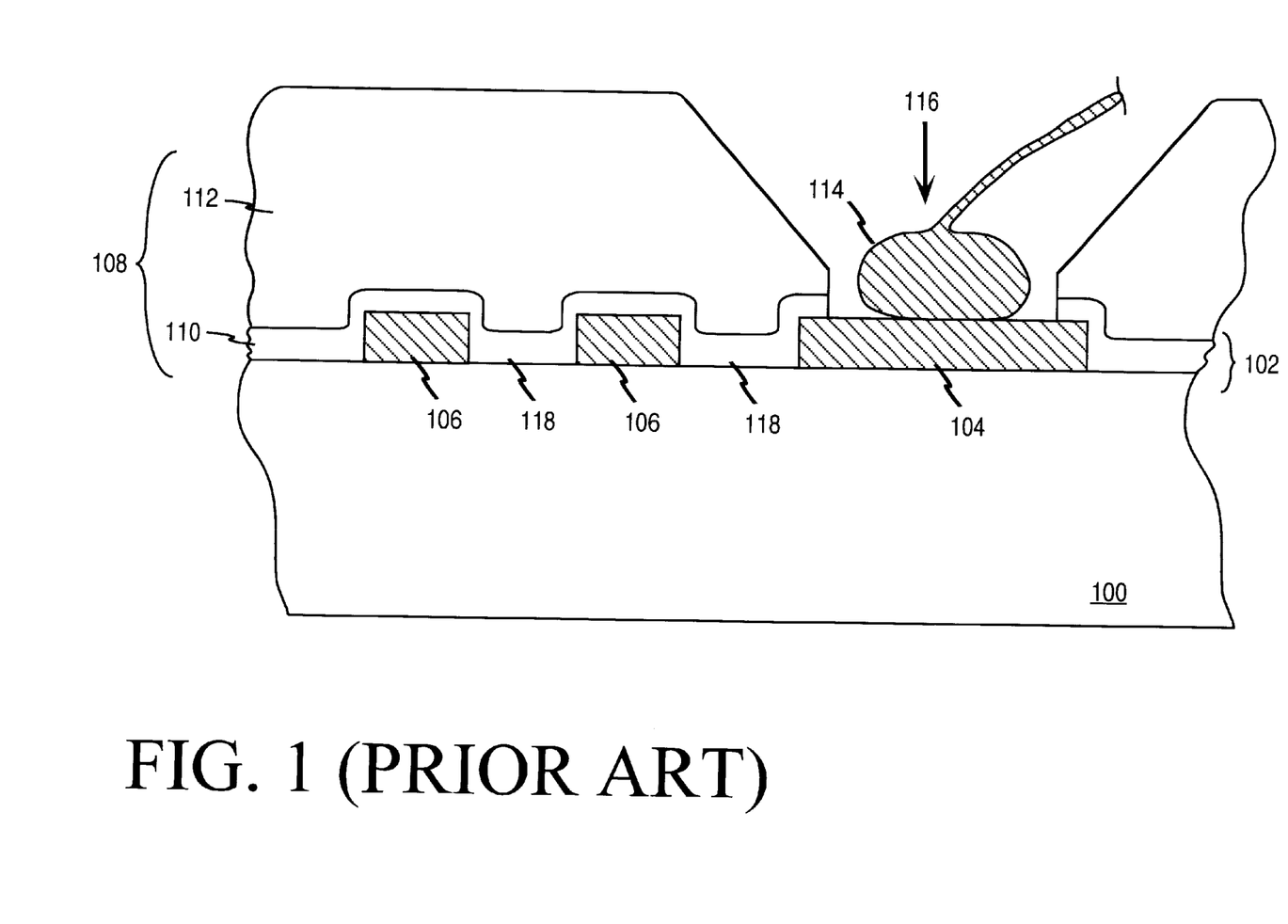
FIG. 1 is an illustration of a cross-sectional view showing a conventional passivation structure.

An example of a conventional passivation structure is shown in FIG. 1. FIG. 1 shows a substrate 100 having formed on its outer surface a metal interconnect layer 102 which includes a bond pad 104 and interconnects 106. A passivation layer 108 which includes a silicon nitride layer 110 and a thick polyimide layer 112 is formed over metal layer 102 as shown in FIG. 1. A contact opening 114 is then formed through the silicon nitride layer 110 and the polyimide layer 112 to enable an electrical contact, such as a wire bond 116, to be made to bond pad 104 to enable the inputting and outputting of external signals to the substrate. Silicon nitride layer 110, which is a hermetic layer, is formed in direct contact with the lower metal layer 102 to ensure that no moisture path exists to the underlying substrate, especially in the bond pad openings 114.

Although such a passivation structure provides an excellent hermetic seal of substrate 100, device performance suffers due to high metal line-to-metal-line capacitance. That is, because silicon nitride layer 110 has a high dielectric constant (approximately 7.0) and because it is formed in gaps 118 between adjacent metal features 104 and 106, line-to-line capacitive coupling is increased and device performance reduced. Another problem associated with the passivation structure shown in FIG. 1 is that it is difficult to deposit a silicon nitride layer into high aspect ratio gaps 118 to a thickness necessary to obtain a sufficient hermetic seal.

Thus what is desired is a passivation structure and methodology which forms a hermetic seal and which provides low interconnect capacitance.

SUMMARY OF THE INVENTION

A novel passivation structure and its method of fabrication. According to the present invention a first dielectric layer is formed upon a conductive layer formed over a substrate. The first dielectric layer and the conductive layer are then patterned into a first dielectric capped interconnect and a dielectric capped bond pad. Next, a second dielectric layer is formed over and between the dielectric capped interconnect and the dielectric capped bond pad. The top portion of the second dielectric layer is removed so as to expose the dielectric capped bond pad and the dielectric capped interconnect. A third dielectric layer is then formed over the exposed dielectric capped bond pad and the exposed dielectric capped interconnect and over the second dielectric.

BRIEF DESCRIPTION OF THE DRAWINGS

FIG. 2b is an illustration of a cross-sectional view showing the formation of a hard mask capped interconnect separated by a gap from a hard mask capped bond pad on the substrate of FIG. 2a.

DETAILED DESCRIPTION OF THE PRESENT INVENTION

The present invention is a hermetic passivation structure with low line to line interconnect capacitance and its method of fabrication. In the following description numerous specific details such as materials, thicknesses, and processes are set forth in order to provide a thorough understanding of the present invention. It will be obvious however, to one skilled in the art that the present invention may be practiced without these specific details. In other instances well known semiconductor processes and equipment have not been explained in detail in order to not unnecessarily obscure the present invention.

The present invention is a hermetic passivation structure which exhibits low line to line capacitance and has a VLSI manufacturable process. According to the present invention the outer most level of metallization is formed over a substrate. A hard mask comprising a hermetic dielectric is then formed over the metal layer. The hard mask and the metal layer are then patterned into interconnects and bond pads which are capped with the hard mask. A gap fill dielectric layer, such as a low k silicon dioxide layer, is then blanket deposited over and between the hard mask capped interconnects and bond pads. The gap fill dielectric layer is then polished or etched back until it is substantially planar with the top surface of the hard mask formed on the interconnects and bond pads. A hermetic sealing dielectric layer, such as silicon nitride, is then formed over the gap fill dielectric and the hard mask. Bond pad openings are then formed through the hermetic sealing and hard mask dielectric layers to expose the bond pads and enable electrical contacts thereto.

The present invention produces a low capacitance dielectric structure because low k materials are used to fill the gaps between the metal interconnects and bond pads. The passivation structure is hermetic because the hard mask dielectric and the sealing dielectric layer seal or encapsulate the low k gap fill material. It is to be appreciated that low k gap materials such as silicon dioxide are generally susceptible to moisture penetration. Thus, Applicants method of fabrication produces a passivation structure which is both hermetic and which exhibits low interconnect capacitance.

Figure 2A:
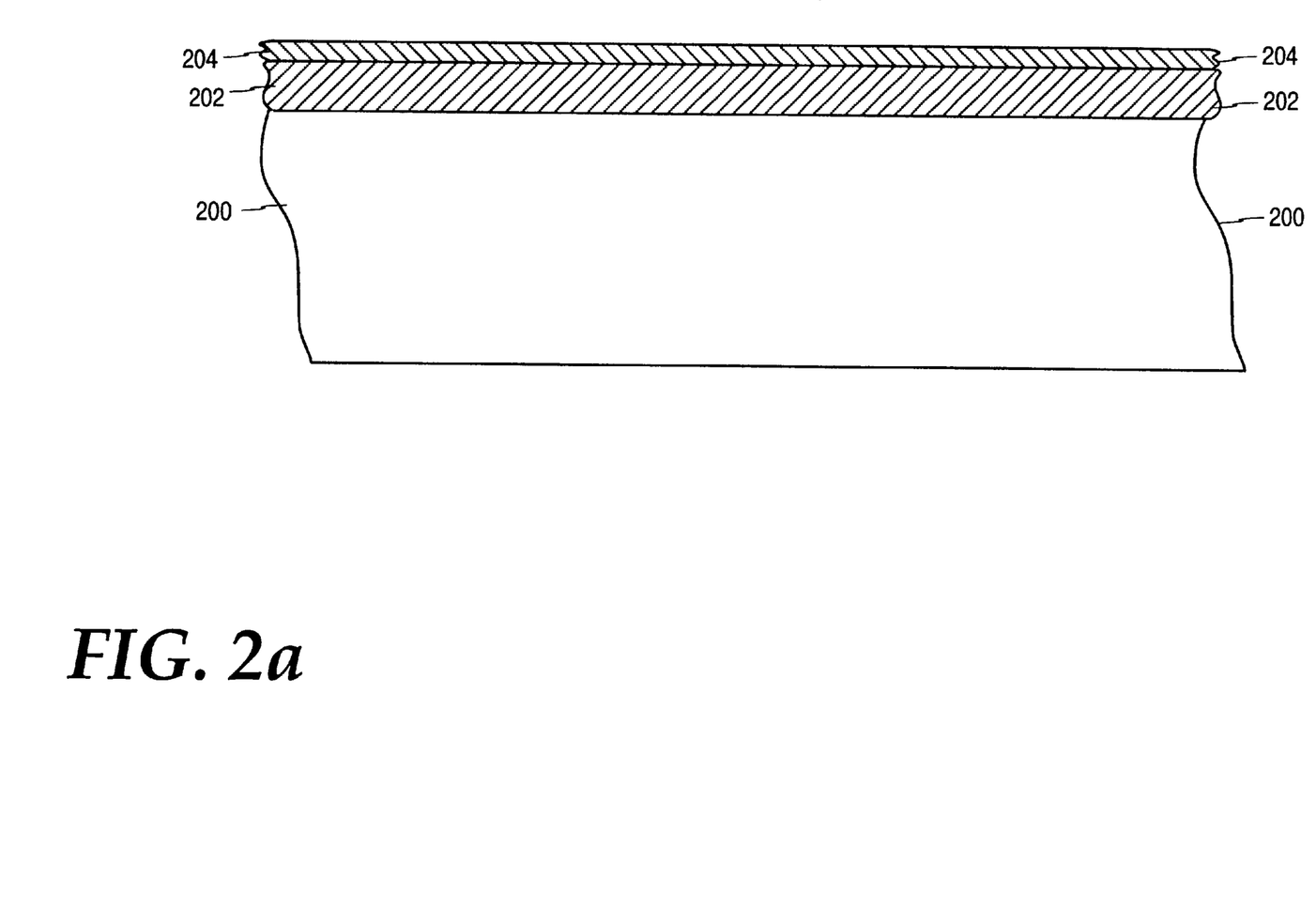
FIG. 2a is an illustration of a cross-sectional view showing the formation of a conductive layer and a hard mask dielectric layer on a substrate.

FIGS. 2a–2g illustrate a method of fabricating a passivation structure in accordance with the present invention. According to the present invention a substrate 200 such as shown in FIG. 2a is provided. Substrate 200, as is well known in the art, will typically include a silicon substrate, with devices such as transistors and capacitors, formed therein. Additionally substrate 200 includes an interconnect structure which couples the fabricated devices into functional circuits. Interconnect structures typically include multiple levels of interconnect lines electrically isolated from one another by insulating layers such as silicon dioxide and electrically coupled together with metal plugs or vias. The outer most surface of substrate 200 at this point will generally include an insulating layer with metal plugs formed at locations where electrical contact to a subsequently formed final metal layer is desired. It is to be appreciated that substrate 200 need not necessarily include a semiconductor substrate used to fabricate integrated circuits but may be any type of substrate such as those used for flat panel displays. For the purposes of the present invention a substrate is defined as the starting material on which films of the present invention are formed and on which processes of the present invention act.

Next as also shown in FIG. 2a, a conductive layer 202 is blanket deposited over substrate 200. Conductive layer 202 is typically the outermost level of metallization of the integrated circuit and is generally used to form the final level of metal interconnects and to form bond pads for the electrical coupling of components and systems to an integrated circuit formed on substrate 200. Conductive layer 202 is a low resistance metal such as aluminum (Al) doped with a small amount of copper (Cu). Conductive layer 202 however can be any low resistance material or alloy such as but not limited to copper (Cu), gold (Au), silver (Ag), and tungsten (W). Conductive layer 202 may or may not include adhesion and/or barrier layers such as but not limited to titanium (Ti), titanium nitride (TiN) and titanium tungsten (TiW). Conductive layer 202 can be formed by any well known technique such as but not limited to sputtering, chemical vapor deposition, and electroplating. Conductive layer 202 can be formed to a thickness of between 1–3 microns.

Next, as also shown in FIG. 2a, a hard mask 204 layer is formed over conductive layer 202. Hard mask 204 is a moisture resistant dielectric material so that a hermetic seal can be formed on conductive layer 202. Additionally hard mask 202 is preferably formed of a material sufficiently hard and deposited to a thickness sufficient to enable hard mask 204 to act as a polish stop for a subsequent polish of a gap fill dielectric. Hard mask 204 can be for example silicon nitride or silicon oxynitride formed by plasma enhanced chemical vapor deposition. Because hard mask 204 is formed on the metal features and not between the metal features, hard mask 204 can be formed from a moisture resistant dielectric with a high dielectric constant (i.e., greater than 4.0) without adversely affecting performance. Hard mask 204 can be formed to a thickness between 100–500 nm.

Figure 2B:
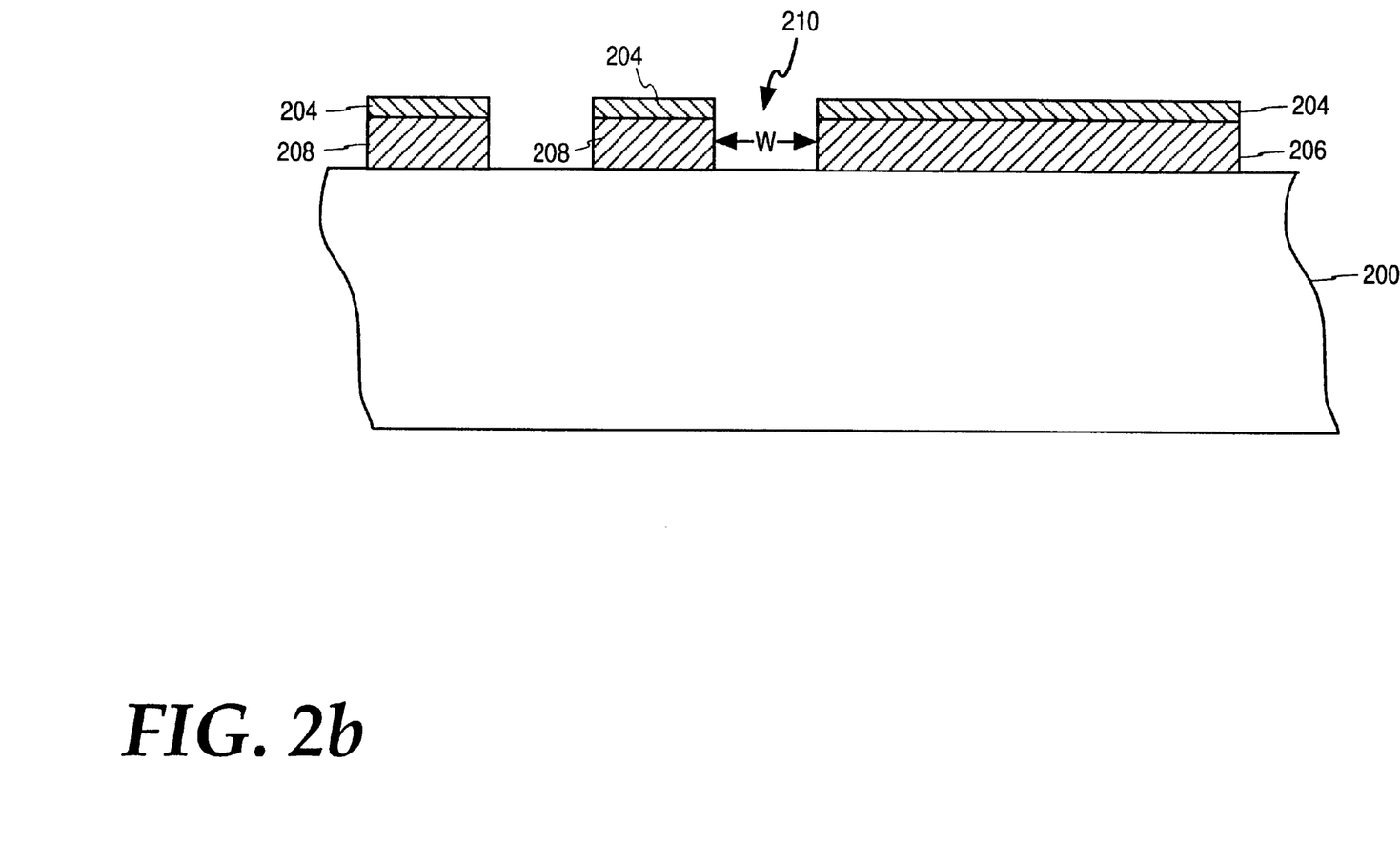

Next as shown in FIG. 2b, hard mask 204 and conductive layer 202 are patterned into metal features which include bond pads 206 and metal interconnections 208 which are capped by hard dielectric layer 204. The individual metal features are separated by gaps 210. The minimum spacing or width (W) of gaps 210 is defined by the critical dimensions of the process utilized, which in the present invention can be less than 0.3 microns. Such narrow feature spacing creates high aspect ratio gaps 210 (i.e., minimum width gaps can have an aspect ratio >2.0). Aspect ratio is defined as gap height over gap width.

Hard mask 204 and conductive layer 202 can be patterned into dielectric capped bond pads and dielectric capped interconnects by forming a photoresist mask by well known photolithography techniques over hard mask 204. Well known etching techniques such as but not limited to reactive ion etching can then be used to pattern the conductive layer 202 and hard mask 204 into hard mask capped bond pads 206 and hard mask capped interconnects 208. It is to be appreciated that hard mask 204 can be patterned first using the photoresist mask and then the photoresist mask stripped and the pattern hard mask used as a mask for the patterning of the conductive layer 202. Alternatively both the hard mask 204 and the conductive layer 202 can be patterned prior to removal of the photoresist mask.

Figure 2C:
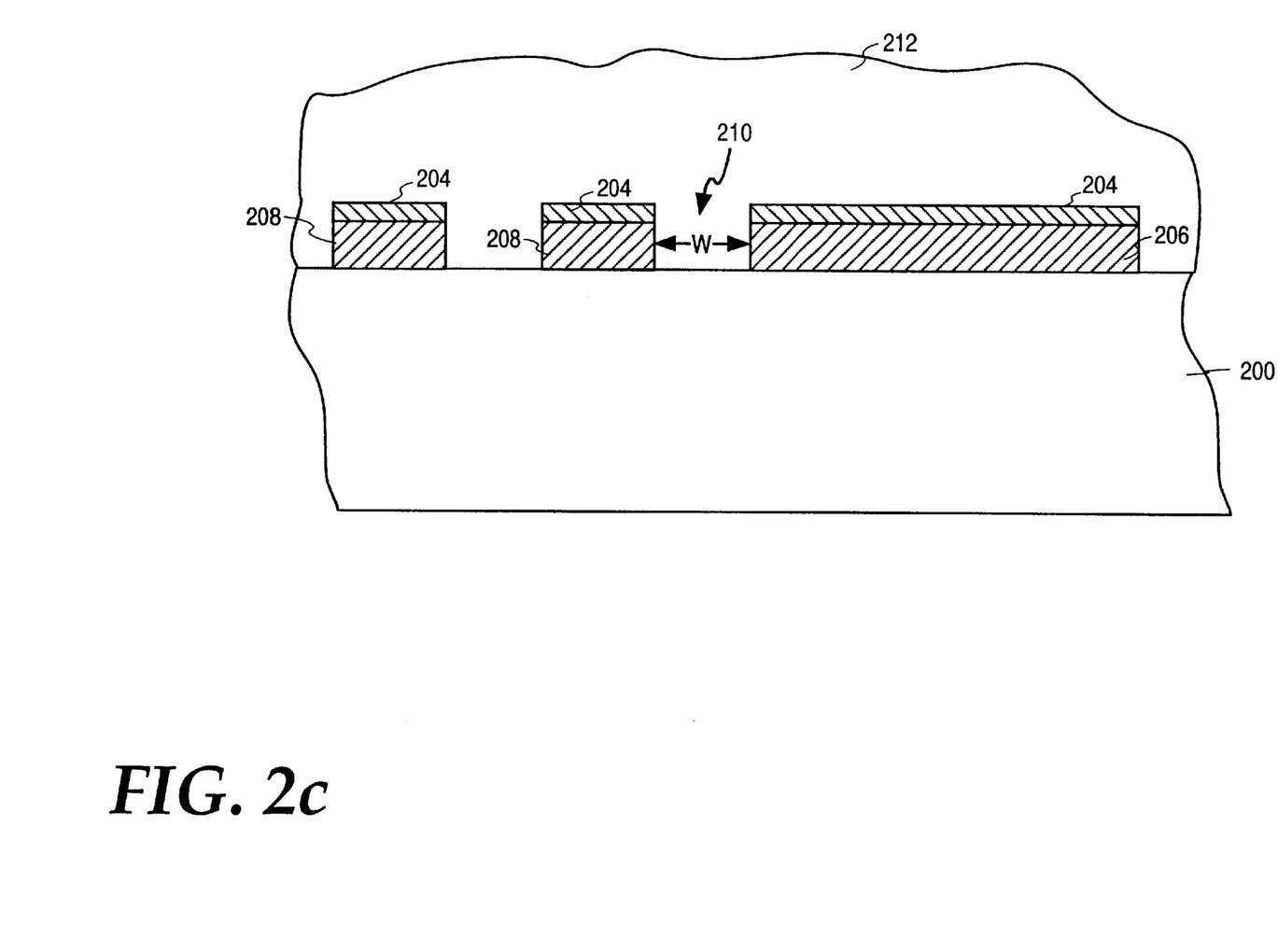
FIG. 2c is an illustration of a cross-sectional view showing the formation of a gap fill dielectric layer over the substrate of FIG. 2b.

Next, as shown in FIG. 2c, a gap fill dielectric layer 212 is deposited over hard mask capped interconnects 208 and hard mask capped bond pads 206 and over substrate 200 in gap 210. Gap fill dielectric layer 212 is formed to a thickness and in such a manner so as to completely fill gaps 210. Gap fill dielectric layer 212 is formed to at least a minimum thickness which is sufficient to fill the minimum width gaps but yet is preferably deposited thicker to enable planarization of dielectric layer 212. That is gap fill dielectric layer 212 needs to be deposited to a thickness of at least as great as the combined thickness of layers 202 and 204, but is preferably deposited thicker to provide sufficient margin for a subsequent planarization step.

Dielectric layer 212 is preferably formed of a material which has a dielectric constant at least as low as silicon dioxide (i.e., a dielectric constant $\leq 4.0$). In one embodiment of the present invention gap fill dielectric layer 212 is a silicon dioxide ($SiO_2$) film formed by high density plasma (HDP) utilizing a chemistry comprising $SiH_4$ and $O_2$ with a substrate temperature of between 350–400° C. Such a process provides excellent gap filling which enables the filling of high aspect ratio gaps 210. Gap fill dielectric layer 212 can be doped with fluorine ions in order to further reduce the dielectric constant of the film. Gap fill dielectric 212 can be doped insitu (during the deposition of film 212) or after the formation by ion implantation. It is to be appreciated that low k dielectric film such as but not limited to aerogels, polyimides, spin-on glasses, can also be used as gap fill dielectric layer 212. Additionally gap fill dielectric layer 212 need not necessarily be a single layer dielectric film but may be a composite film made up of several different dielectric layers.

Figure 2D:
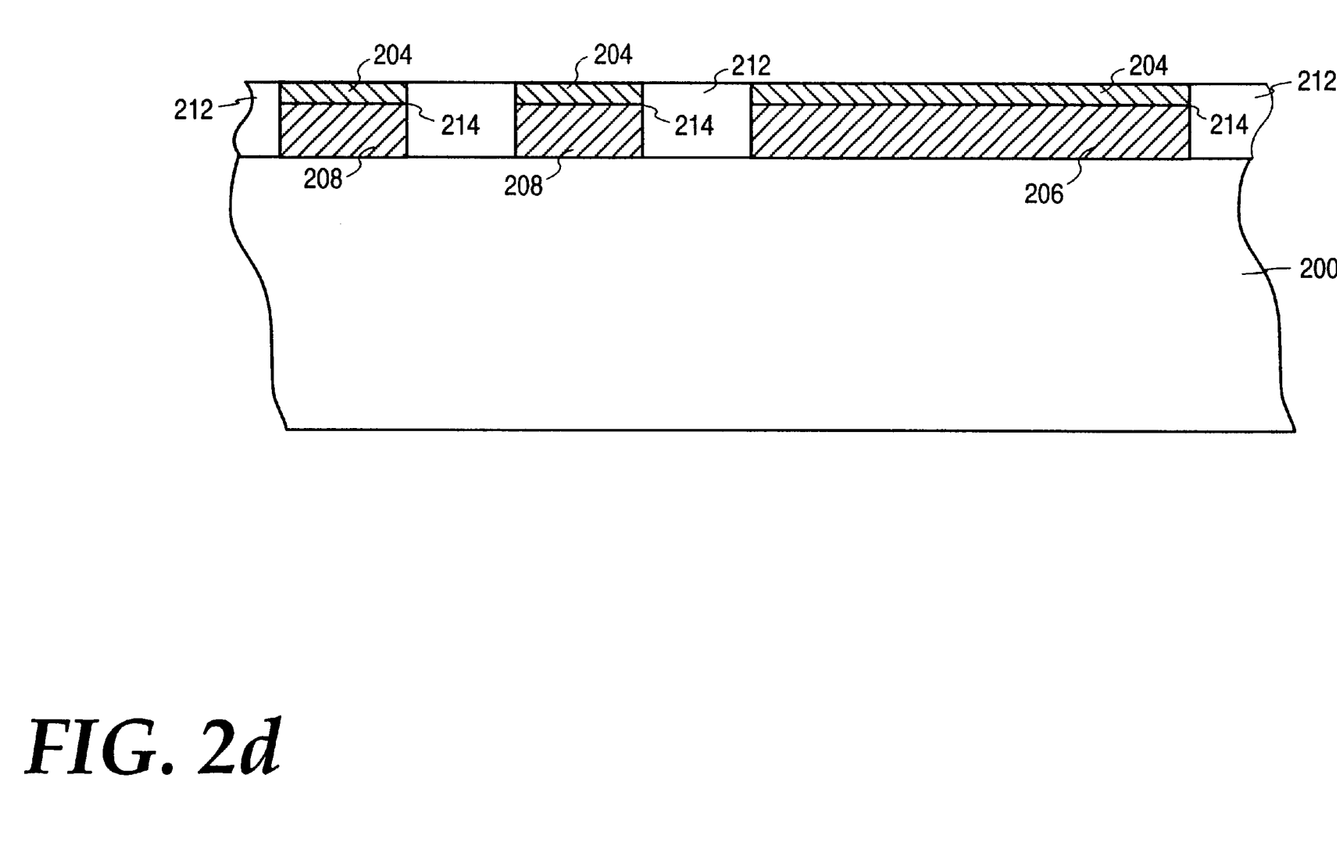
FIG. 2d is an illustration of a cross-sectional view showing the planarization of the gap fill dielectric on the substrate of FIG. 2c.

Next, as shown in FIG. 2d, gap fill dielectric 212 is planarized so that the top surface of gap fill dielectric 212 is substantially even or planar with the top surface of hard mask 204 on interconnect 208 and hard mask 204 on bond pad 206. Gap fill dielectric 212 is preferably planarized utilizing well known chemical mechanical polishing techniques. The use of hard mask 204 as a polish stop assures that the polish step will stop when the top surface of the gap fill material is level with the top surface of the hard mask 204, and thereby ensure that gap fill dielectric 212 is not recessed below the top surface of metal features formed in conductive film 202. In this way, only low dielectric constant gap fill material 212 is formed between the metal features which produces low capacitance, high performance electrical interconnections.

Although polishing is presently the preferred method of planarizing gap fill dielectric 212, other suitable well known techniques such as but not limited to plasma etchback may be used if desired.

Figure 2E:
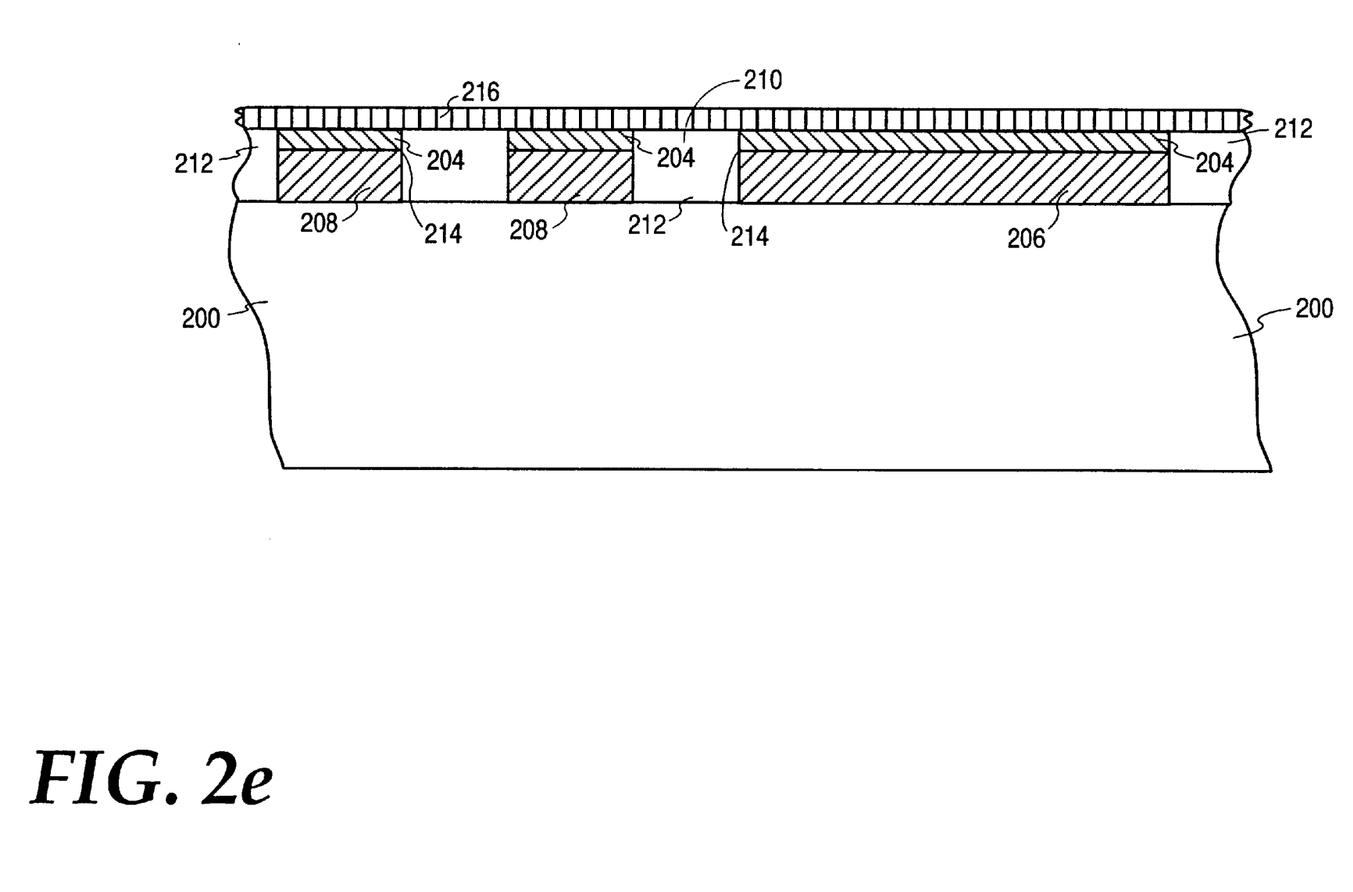
FIG. 2e is an illustration of a cross-sectional view showing the formation of a sealing dielectric layer on the substrate of FIG. 2d.

Next, as shown in FIG. 2e, a sealing dielectric layer 216 is blanket deposited over gap fill dielectric 212 and onto the hard mask 204 of capped interconnects 208 and capped bond pads 206. Sealing dielectric layer 216 is formed of a material which is resistant to moisture penetration (i.e., is formed of a material which is hermetic). A layer is said to be hermetic if it can prevent moisture penetration under humid ambients at normal chip operating temperatures, typically between 100–120° C. Sealing dielectric 216 is formed as thin as possible while still providing a hermetic seal. In one embodiment of the present invention sealing dielectric layer 216 is a silicon nitride film formed to a thickness of between 500–1500 Å by plasma enhanced chemical vapor deposition (CVD) utilizing a chemistry comprising silane ($SiH_4$) and ammonia ($NH_3$) while maintaining a substrate temperature of between 380–400° C. It is to be appreciated that because hermetic dielectric layers, such as silicon nitride, have high dielectric constants (greater than 4.0 and typically about 7), it is important to keep sealing dielectric layer 216 above the top surface 214 of the metal features formed in conductive layer 202 and out of gaps 210 so that its high dielectric constant does not increase the capacitive coupling between adjacent metal features and thereby decrease device performance.

Figure 2F:
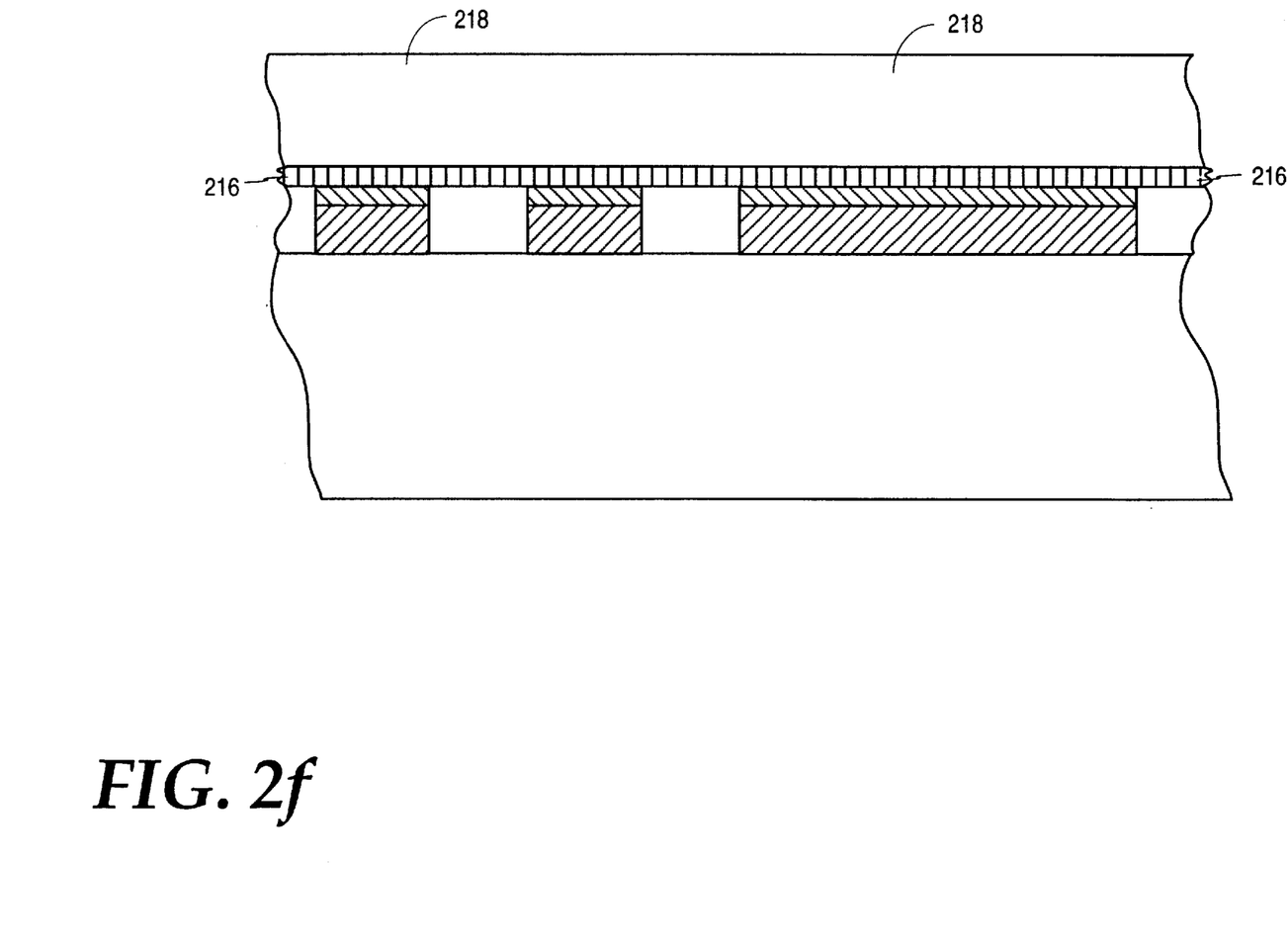
FIG. 2f is an illustration of a cross-sectional view showing the formation of a polyimide layer on the substrate of FIG. 2e.

Next, as shown in FIG. 2f, a capping dielectric layer 218, if desired, can be formed over sealing dielectric layer 216 if desired. Capping dielectric layer 218 provides stress relief between the package and substrate 200 and also provides scratch protection for sealing dielectric 216 so that scratches cannot affect integrity of the hermetic seal formed by sealing dielectric layer 216. In one embodiment of the present invention capping dielectric layer 216 is a photodefinable polyimide, such as photodefinable polyimide number 1708 manufactured by Hitachi. Such a polyimide can be "spun-on" as is well known in the art to a thickness between 2.0–10 microns. Alternatively, capping dielectric 218 can be formed of other materials such as but not limited to a CVD deposited silicon dioxide layer.

Figure 2G:
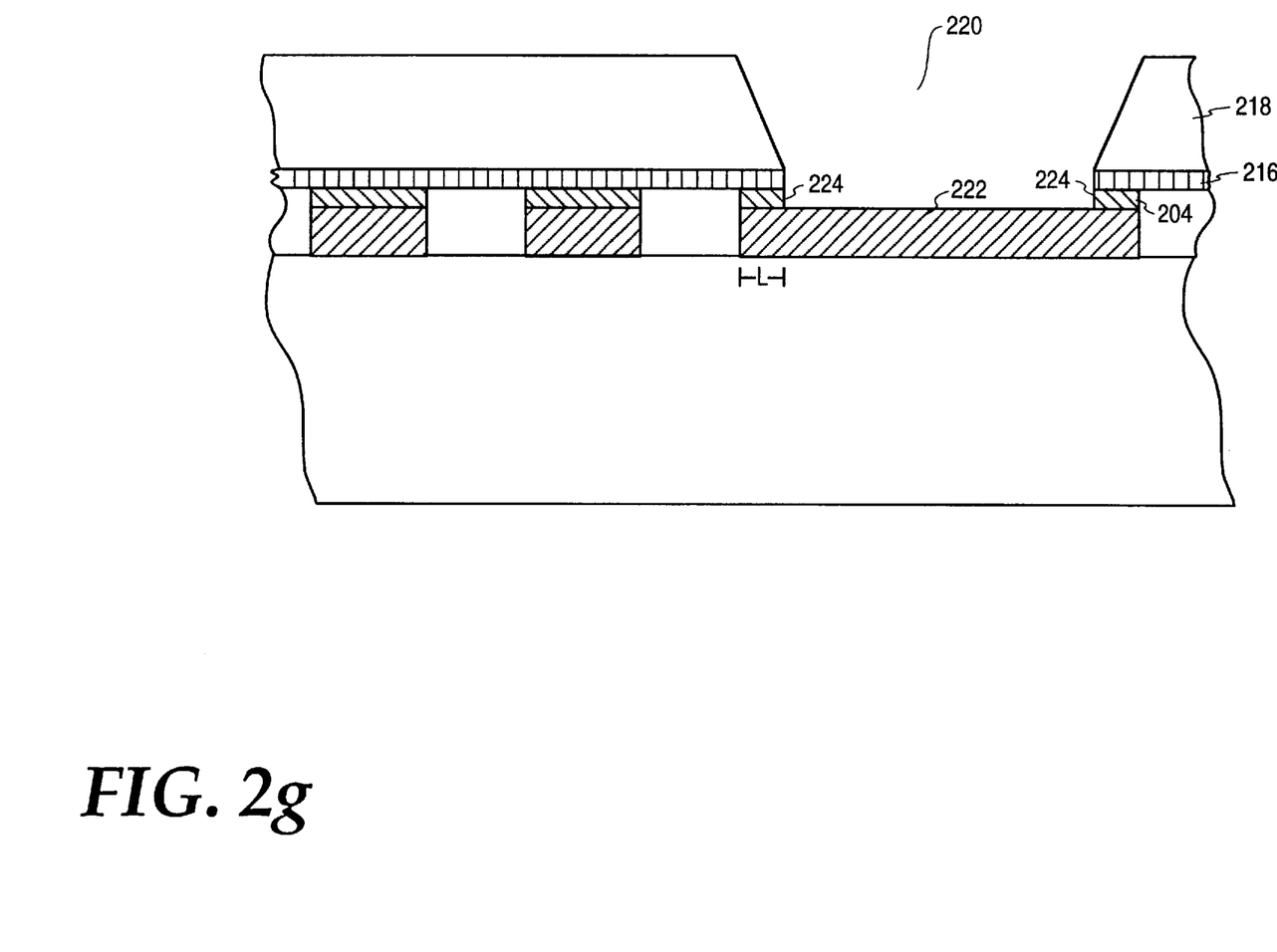
FIG. 2g is an illustration of a cross-sectional view showing the formation of a bond pad opening in the substrate of FIG. 2f.

Next, a bond pad opening 220 is formed through capping dielectric layer 218, sealing dielectric layer 216, and hard mask 204 to expose the top surface 222 of bond pad 206 as shown in FIG. 2g. If dielectric layer 218 is a photodefinable polyimide, then opening 220 can be defined in dielectric layer 218 by masking, exposing and then developing a way that light exposed portion of the dielectric layer 218 where bond pad opening 220 is desired. Patterned capping dielectric layer 218 can then be used as a mask for etching of sealing dielectric layer 216 and hard mask 204. If sealing dielectric layer 216 is a silicon nitride layer and hard mask 204 is a silicon nitride or silicon oxynitride layer, then sealing dielectric layer 216 and hard mask 204 can be anisotropically etched by reactive ion etching (RIE) with the chemistry comprising $SF_6$ and He. Once the top surface 222 of bond pad 206 has been exposed the chemistry can be changed to $NF_3$ and Ar to conduct an overetch to ensure complete removal of hard mask 204 in bond pad opening 220.

If dielectric layer 218 is not a photodefinable material then a standard photoresist mask can be formed over dielectric layer 218 and patterned by well known photolithography techniques.

Figure 2H:
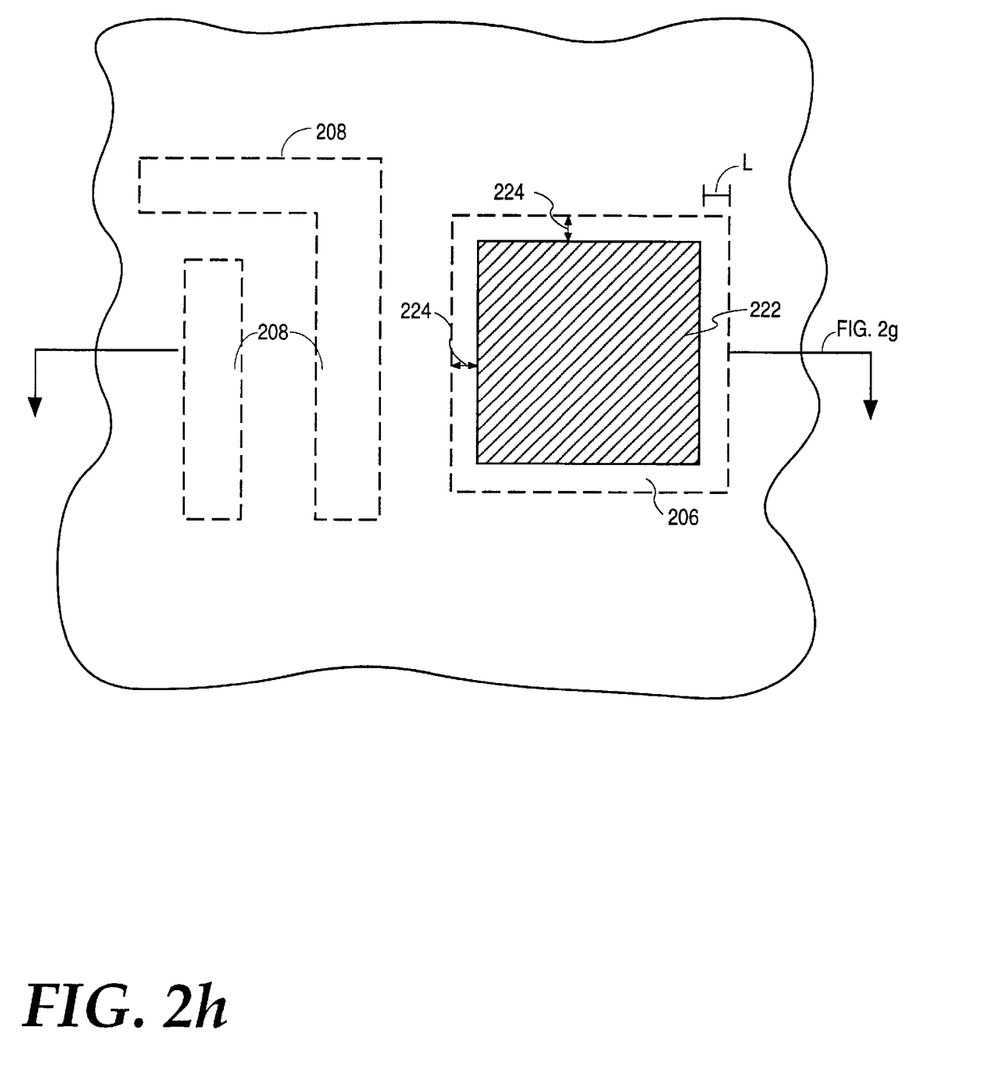
FIG. 2h is an illustration of an overhead view showing the substrate of FIG. 2g.

The formation of bond pad opening 220 leaves a portion 224 of hard mask 204 around the periphery of bond pad 206 as shown in FIG. 2g. The length (L) of the portion 224 of hard mask 204 around the periphery of bond pad 220 is a length sufficient to prevent moisture penetration into gap fill dielectric 212 through bond pad opening 220 and is of a sufficient length to provide good adhesion to bond pad 206. The length (L) of hard mask 224 around the periphery of bond pad 220 can be between two to ten microns. FIG. 2h is an illustration of an overhead view of FIG. 2g showing interconnect 208 and bond pad 206 as broken lines. FIG. 2h further illustrates how the exposed portion 222 of bond pad 206 is surrounded by hard mask 224 to provide a seal of substrate 220 by preventing moisture penetration through bond pad opening 220.

As is readily apparent from FIGS. 2g and 2h, the process of the present invention forms a passivation structure which has low metal-line to metal-line capacitance and which provides a hermetic seal of substrate 200. Line-to-line capacitance is reduced because a low dielectric constant gap fill dielectric layer 212 is formed in gaps 210 between metal lines and because high dielectric constant materials such as sealing dielectric layer 216 and hard mask dielectric layer 204 are kept above metal features 208 and 206 and out of gaps 210. A hermetic seal of substrate 200 is formed by sealing dielectric layer 216, hard mask portion 224, and bond pad 206. Sealing dielectric layer 216 prevents moisture from entering through the top surface of gap fill dielectric 212, while hard mask portion 224 and sealing dielectric layer 216 prevent moisture from entering through the sidewalls of bond pad opening 220.

Figure 2I:
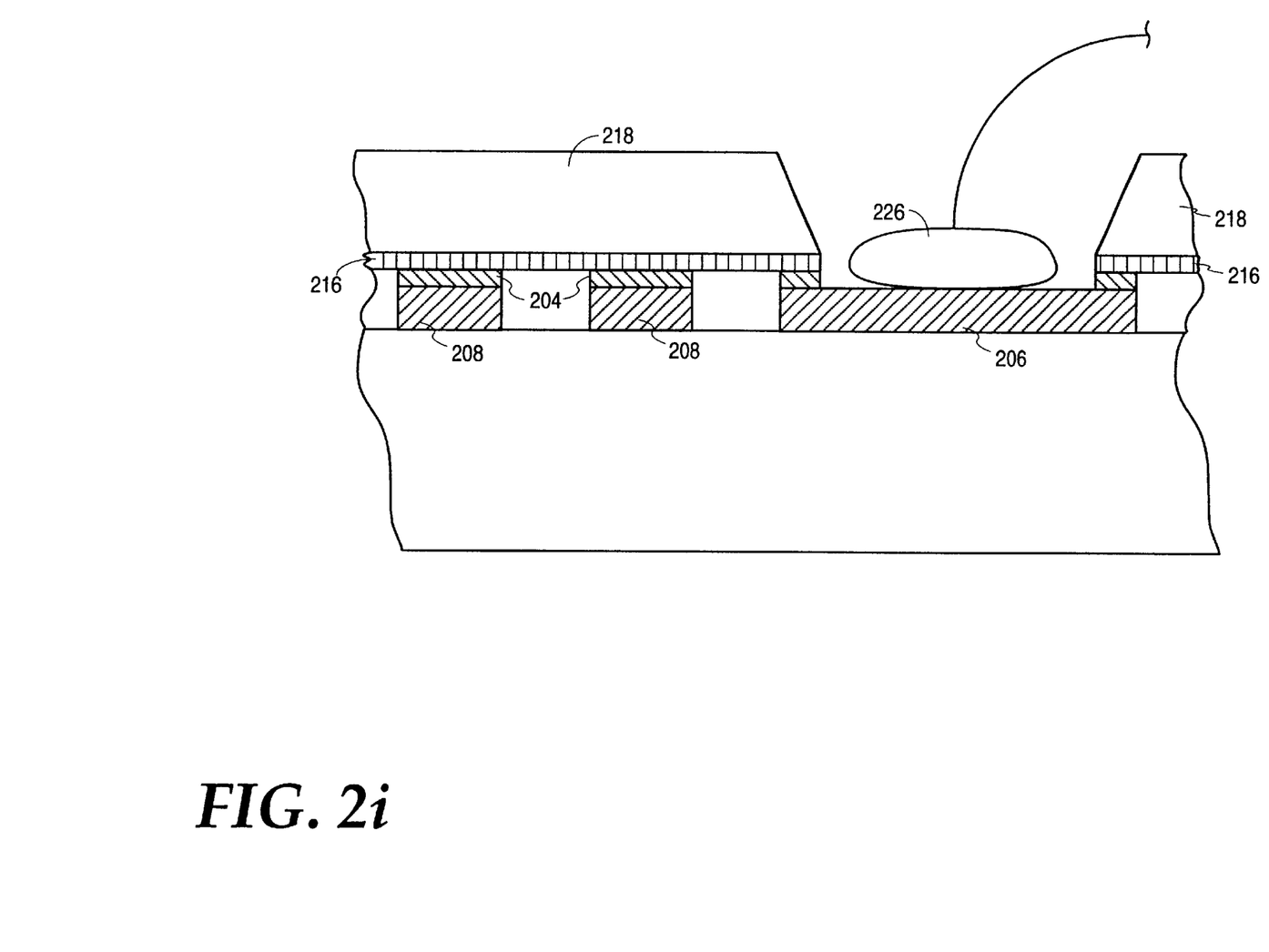
FIG. 2i is an illustration of a cross-sectional view showing the formation of an electrical contact on the bond pad of FIG. 2g.

Next, as shown in FIG. 2i, an electrical contract 226 is made through bond pad opening 220 to the exposed surface 222 of bond page 206. Because sealing dielectric 216, hard mask 224, and bond pad 206 have hermetically sealed substrate 200 from moisture penetration through substrate opening 220, any well known electrical coupling technique can be made to bond pad 220. Although FIG. 2i shows an embodiment of the present invention which utilizes well known wire bond contacts, other well known electrical contacting techniques can be used such as but not limited to control chip collapse contacts (C4) and tape automated bonding (TAB).

Thus, a low interconnect capacitance passivation structure which provides a hermetic seal and its method of fabrication have been described.

We claim:

1. An integrated circuit comprising:
    an interconnect separated by a gap from a bond pad, said bond pad and said interconnect formed on an insulating layer and formed from the outermost level of metalization of an integrated circuit;
    a first hermetic dielectric layer formed on said interconnect and on and around the periphery of said bond pad wherein said first hermetic dielectric layer is formed only on the top of said interconnect and on the top of said bond pad and not in said gap between said interconnect and bond pad;
    a gap fill dielectric layer formed on said insulating layer in said gap, said gap fill dielectric layer having a dielectric constant of less than or equal to 4.0;
    a second hermetic dielectric layer formed on said first hermetic dielectric layer on said interconnect and on said first hermetic dielectric layer on and around the periphery of said bond pad, and on said gap fill dielectric layer in said gap wherein said second hermetic dielectric layer comprises silicon nitride;

a polyimide layer formed on said second hermetic dielectric layer; and an electrical contact formed on said bond pad within said first hermetic dielectric layer, said gap fill dielectric layer, and said second hermetic dielectric layer on the periphery of said bond pad.

2. An integrated circuit comprising:

an interconnect separated by a gap from a bond pad, said bond pad and said interconnect formed on an insulating layer and formed from the outermost level of metalization of an integrated circuit;

a hard mask dielectric formed on said interconnect and around the periphery of said bond pad wherein said hard mask dielectric is formed only on the top of said interconnect and on the top of said bond pad and not in said gap between said interconnect and bond pad;

a gap fill dielectric formed on said insulating layer in said gap, said gap fill dielectric having a dielectric constant of less than or equal to 4.0;

a hermetic sealing dielectric formed on said hard mask dielectric on said interconnect and on said hard mask dielectric on and around the periphery of said bond pad, and on said gap fill dielectric; and a contact on said bond pad within said hard mask dielectric formed around the periphery of said bond pad, wherein said contact is selected from the group consisting of a wire bond, a control chip collapse contact, and tape automated bonding contact.

3. The integrated circuit of claim 2 wherein said hermetic sealing dielectric has a thickness between 500–1500 Å.

4. The integrated circuit of claim 2 wherein the length of the hard mask dielectric formed around the periphery of said bond pads is between 2–10 microns.

5. The integrated circuit of claim 2 wherein a polyimide layer is formed on said hermetic sealing dielectric.

6. An integrated structure comprising:

a conductive member separated by a gap from a bond pad, said bond pad and said conductive member formed on an insulating layer and formed from the outermost level of metalization of an integrated circuit;

a first dielectric layer formed on said conductive member and on and around the periphery of said bond pad wherein said first dielectric layer is formed only on the top of said conductive member and on the top of said bond pad and not in the gap between said conductive member and said bond pad;

a second dielectric layer formed on said insulating layer in said gap;

a third dielectric layer formed on said first dielectric layer on said conductive member and on said first dielectric layer on and around the periphery of said bond pad, and on said second dielectric layer in said gap wherein said third dielectric layer is hermetic; and a contact on said bond pad within said first dielectric layer formed on the periphery of said bond pad.

7. The integrated circuit of claim 6 further comprising a polyimide layer formed on said third dielectric layer.

8. The integrated circuit of claim 6 wherein said first dielectric layer is selected from the group consisting of silicon nitride and silicon oxynitride.

9. The integrated circuit of claim 6 wherein said second dielectric layer comprises silicon dioxide.

10. The integrated circuit of claim 6 wherein said third dielectric layer is silicon nitride.

11. The integrated claim 6 wherein said first dielectric is resistant to moisture penetration.

12. The integrated circuit of claim 6 wherein said contact is a wire bond.

13. The integrated circuit of claim 6 wherein said contact is a C4 bump.

14. The integrated circuit of claim 6 wherein said third dielectric layer has a higher dielectric constant than said second dielectric.

15. The integrated circuit of claim 6 wherein said second layer dielectric is a low k dielectric.

16. The integrated circuit of claim 6 wherein said third dielectric layer has a thickness between 500–1500 Å.

17. The integrated circuit of claim 6 wherein the length of the first dielectric layer formed around the periphery of said bond pad is between 2–10 microns.

* * * * *

UNITED STATES PATENT AND TRADEMARK OFFICE
CERTIFICATE OF CORRECTION

PATENT NO. : 6,566,737 B2
DATED : May 20, 2003
INVENTOR(S) : Bohr

It is certified that error appears in the above-identified patent and that said Letters Patent is hereby corrected as shown below:

Column 3,
Lines 30 and 66, after the word "Next", insert -- , --.

Column 8,
Line 24, after the word "integrated", insert -- circuit of --.

Signed and Sealed this

Twenty-second Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,566,737 B2  
DATED : May 20, 2003  
INVENTOR(S) : Bohr

Page 1 of 1

It is certified that error appears in the above-identified patent and that said Letters Patent is hereby corrected as shown below:

Column 7,  
Line 3, after the phrase "formed on", insert -- a portion of --.  
Lines 3 and 25, after the word "pad", insert -- that is --.  
Line 25, after the phrase "contact on", insert -- a portion of --.  
Line 29, before the word "tape", insert -- a --.

Column 8,  
Line 13, after the phrase "contact on", insert -- a portion of --.  
Line 13, after the word "pad", insert -- that is --.  
Line 32, after the word "dielectric", insert -- layer --.

Signed and Sealed this

Eighth Day of February, 2005

JON W. DUDAS  
*Director of the United States Patent and Trademark Office*